(12) United States Patent
Yamamoto

(10) Patent No.: US 7,609,390 B2
(45) Date of Patent: Oct. 27, 2009

(54) MEASUREMENT METHOD AND APPARATUS, EXPOSURE APPARATUS

(75) Inventor: Kazuki Yamamoto, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 283 days.

(21) Appl. No.: 11/695,240

(22) Filed: Apr. 2, 2007

(65) Prior Publication Data
US 2007/0229848 A1 Oct. 4, 2007

(30) Foreign Application Priority Data
Apr. 3, 2006 (JP) ............................. 2006-101874

(51) Int. Cl.
*G01B 11/02* (2006.01)
(52) U.S. Cl. ..................................... 356/515
(58) Field of Classification Search ................. 356/515, 356/521
See application file for complete search history.

(56) References Cited

U.S. PATENT DOCUMENTS 6,312,373 B1    11/2001  Ichihara
2002/0001088 A1*  1/2002  Wegmann et al. ........... 356/521
2003/0091913 A1*  5/2003  Shiode ........................ 430/22
2004/0032579 A1*  2/2004  Emer et al. ................... 356/72
2005/0190378 A1   9/2005  Nakauchi

FOREIGN PATENT DOCUMENTS

| JP | 2000-097666 | 4/2000 |
| JP | 2005-244126 | 9/2005 |

* cited by examiner

*Primary Examiner*—Michael A Lyons
(74) *Attorney, Agent, or Firm*—Rossi, Kimms & McDowell, LLP

(57) ABSTRACT

A measurement method for measuring a wavefront aberration of a target optical system using a measurement apparatus that measures the wavefront aberration of the target optical system by detecting an interference pattern includes the steps of measuring as a system parameter a shift from a design value of a value that defines a structure of the measurement apparatus and the target optical system, and measuring the wavefront aberration of the target optical system using the system parameter.

3 Claims, 13 Drawing Sheets

MEASUREMENT METHOD AND APPARATUS, EXPOSURE APPARATUS

BACKGROUND OF THE INVENTION

The present invention relates to a measurement method and apparatus.

A conventional projection exposure apparatus projects a circuit pattern of a reticle onto a photosensitive substrate, such as a wafer, via a projection optical system in manufacturing fine semiconductor devices, such as a semiconductor memory and a logic circuit, using the photolithography technology.

Since a projection exposure apparatus is required to precisely transfer a reticle pattern onto a wafer at a predetermined magnification or reduction ratio, use of a projection optical system having an extremely restrained aberration or a superior imaging characteristic is important. In particular, along with the increasing demand for fine processing to semiconductor devices, a transfer pattern is sensitive to the aberration of an optical system. Therefore, there is a demand for a precise measurement of a optical characteristic, such as a wavefront aberration, of the projection optical system. A simple, prompt, and inexpensive measurement is important to improve the mass production and the economical efficiency.

A point diffraction interferometer ("PDI") that has a pinhole that forms an ideal spherical wave, and a lateral shearing interferometer ("LSI") that utilizes the shearing interferometry have conventionally been known as a measurement apparatus that measures a wavefront aberration of the optical system. Recently, a measurement apparatus that utilizes a linear diffraction interferometer ("LDI") having a slit that forms an ideal cylindrical or elliptical wave has been known. See Japanese Patent Applications, Publication Nos. 2000-97666 and 2005-244126.

The LDI type measurement apparatus mounted on the exposure apparatus arranges a plate having a measurement mark on an image plane side of the projection optical system. The measurement mark has a slit that forms an ideal wavefront, and a window that transmits a wavefront of aberrational information of the projection optical system. A two-dimensional light-receiving element is arranged below the plate, and takes an image of interference between two wavefronts generated from the plate. The wavefront aberration of the projection optical system is measured through image processing to the captured interference pattern (interferogram) image.

However, the conventional measurement apparatus cannot precisely measure the wavefront aberration of the projection optical system.

The above image processing contains an image conversion process that converts an interference pattern image from a light receiving plane coordinate to a pupil plane coordinate of the projection optical system, and a wavefront aberration information calculating process that calculates wavefront aberration information from the image-converted interference pattern data.

The image conversion process calculates through ray tracing which coordinate position on the pupil plane in the projection optical system an interference pattern data value at each coordinate position on the light receiving plane comes from. Therefore, it is necessary to know a structure of each member between the pupil plane of the projection optical system and the light receiving plane. A thickness of a plate, a distance between the plate and the light receiving plane, and a positional relationship between the measurement mark and the light receiving plane (a center and radius of the interference pattern on the light receiving plane), which define a structure of the measurement apparatus, are used for input parameters for the image conversion process. A "process parameter" is a generic term of input parameters in this specification.

Among the process parameters, prior art use design values for the thickness of the plate, and the distance between the plate and the light receiving plane. In addition, for a center and radius of the interference pattern, prior art uses a design value, determines it by detecting a region through image processing, or defines it through visual inspections of the pattern region in the interference pattern image. However, a shift occurs between the design value and the actual value due to manufacturing errors of the apparatus, such as a telecentric difference for each image point of the projection optical system, a manufacture error of a plate, and an arrangement error of the light receiving element. When the design value is used for a process parameter, a precise image conversion process cannot be performed, and calculated wavefront aberration information contains a measurement error.

Moreover, even when an image conversion process is performed using for a process parameter a design value that has no shift from an actual value, the wavefront aberration information contains a measurement error, because a manufacturing error of the apparatus cannot be eliminated, such as inclinations among a bottom plane of the projection optical system, a plate plane, and an inclination of a light receiving plane.

This problem is not limited to the LDI type measurement apparatus, but other measurement apparatuses that measure as two-dimensional information an optical characteristic of an optical system, such as a PDI type measurement apparatus and a LSI type measurement apparatus.

SUMMARY OF THE INVENTION

The present invention is directed to a measurement method and apparatus that can precisely measure an optical characteristic of the optical system, such as a wavefront aberration.

A measurement method according to one aspect of the present invention for measuring a wavefront aberration of a target optical system using a measurement apparatus that measures the wavefront aberration of the target optical system by detecting an interference pattern includes the steps of measuring as a system parameter a shift from a design value of a value that defines a structure of the measurement apparatus and the target optical system, and measuring the wavefront aberration of the target optical system using the system parameter.

A further object and other characteristics of the present invention will be made clear by the preferred embodiments described below referring to accompanying drawings.

DESCRIPTION OF THE EMBODIMENTS

Figure 1:
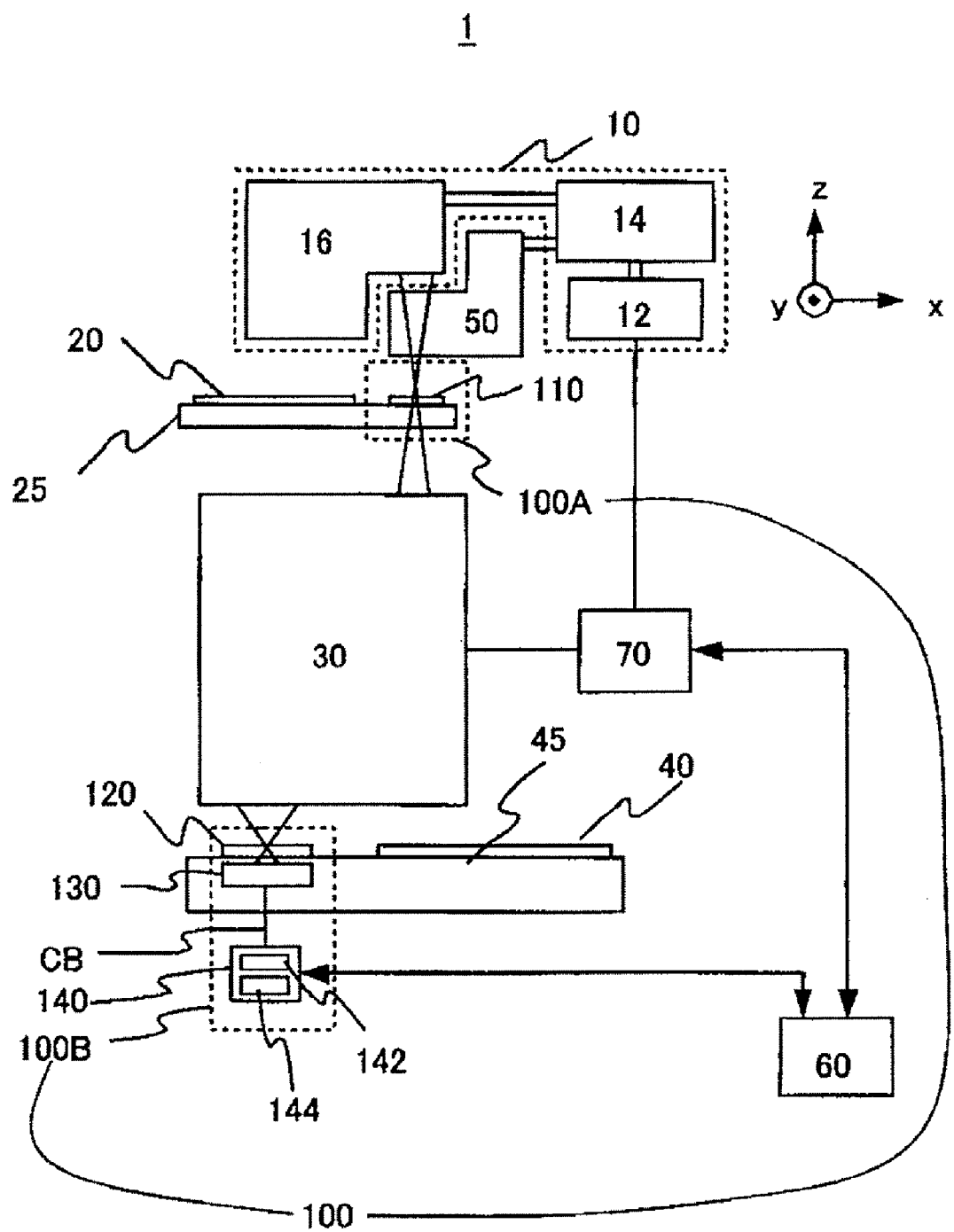
FIG. 1 is a schematic block diagram showing a structure of an exposure apparatus according to one aspect of the present invention.

This inventor has discovered that in order to precisely measure a wavefront aberration, it is necessary to calculate or measure a wavefront aberration using an actual value for a process parameter rather than the design value, and to correct the wavefront aberration. This correction needs to use, for example, a parameter (linearity gain) used to correct an aberrational variance amount of a wavefront aberration measured by the measurement apparatus, and a parameter (absolute value) used to correct the aberration of the member in the measurement apparatus other than the target optical system. The following description refers to a parameter as an "offset parameter" to be reflected on the wavefront aberration measured by the measurement apparatus. A "system parameter" is a generic term of the "process parameter" and the "offset parameter."

A fundamental principle of the inventive measurement apparatus and method reflects a manufacturing error on the "process parameter" as an input parameter of image processing, and an "offset parameter" on the wavefront aberration calculated as an output of the image processing, such as an aberrational amount of each term in the Zernike polynomial.

Referring now to the accompanying drawings, a description will be given of an exposure apparatus according to one aspect of the present invention. In each figure, the same reference numeral designates the same element, and a duplicate description thereof will be omitted.

FIG. 1 is a schematic block diagram showing a structure of the exposure apparatus 1 according to one embodiment of the present invention. The exposure apparatus 1 is a projection exposure apparatus that exposes a circuit pattern of the reticle 20 onto the substrate 40. The exposure apparatus 1 uses a step-and-scan exposure manner to expose the wafer 40. However, the exposure apparatus 1 can use a step-and-repeat manner.

The exposure apparatus 1 includes, as shown in FIG. 1, an illumination apparatus 10, a reticle stage 25 mounted with a reticle 20, a projection optical system 30, a wafer stage 45 mounted with a substrate 40, an alignment optical system 50, a main controller 60, a projection controller 70, and a measurement apparatus 100.

The illumination apparatus 10 illuminates the reticle 20 that has a circuit pattern to be transferred, and includes a light source 12, a deflection optical system 14, and an illumination optical system 16.

The light source 12 uses an ArF excimer laser with a wavelength of approximately 193 nm, or a KrF excimer laser with a wavelength of approximately 243 nm. However, the type of the light source 12 may use an $F_2$ laser with a wavelength of approximately 157 nm. The number of lasers is not limited.

The deflection optical system 14 introduces the light from the light source 12 to the illumination optical system 16 and the alignment optical system 50.

The illumination optical system 16 is an optical system that illuminates the reticle 20, and includes a lens, a mirror, an optical integrator, and a stop. The illumination optical system 16 arranges optical elements in order of a condenser lens, a fly-eye lens, an aperture stop, an optical integrator, a slit, and an imaging optical system.

The reticle 20 is made of quartz, has a circuit pattern to be transferred, and is supported on and driven by the reticle stage 25.

The reticle stage 25 supports the reticle 20, and is connected to a moving mechanism (not shown). The reticle stage 25 supports part of the measurement apparatus 100, or the reticle side measuring part 100A. A moving mechanism (not shown) can move the reticle 20 and a reticle side measuring part 100A in the measurement apparatus 100 by moving the reticle stage 25.

The projection optical system 30 images the pattern of the reticle 20 onto the wafer 40. The projection optical system 30 can use a dioptric, catadioptric, or catoptric system. The measurement apparatus 100 measures an optical characteristic of the projection optical system 30, such as a wavefront aberration.

This embodiment uses the wafer 40 for the photosensitive substrate. However, a glass plate and another substrate may be used instead of the wafer 40. A photoresist is applied to the surface of the wafer 40.

The wafer stage 45 supports the substrate 40 via a wafer chuck (not shown). The wafer stage 45 supports part of the measurement apparatus 100, or a wafer side measuring part 100B. The wafer stage 45 can move the wafer 40 and a wafer side measuring part 100B in the measurement apparatus 100. Positions of the reticle stage 25 and the wafer stage 45 are calibrated by the alignment optical system 50, and both are driven at a constant speed ratio.

The alignment optical system 50 includes an alignment scope, and is arranged outside the optical path during normal exposure. FIG. 1 omits a driving mechanism for driving the alignment optical system 50. The alignment optical system 50 aligns the position of the reticle 20 with the position of the wafer 40 by imaging the alignment marks (not shown) on the reticle 20 and the wafer 40 via the projection optical system 30.

The main controller 60 includes a CPU and a memory, and controls an operation of the exposure apparatus 1. Based on the wavefront aberration of the projection optical system 30 sent from the measurement apparatus 100, the main controller 60 of this embodiment calculates a lens driving amount and a wavelength driving amount necessary to correct the wavefront aberration, and outputs the result to the projection controller 70.

The projection controller 70 controls a lens driving system that drives plural lenses in the projection optical system 30, and a wavelength of the exposure light from the light source 12. The projection controller 70 restrains an aberrational amount of the projection optical system 30 to the desired one. The projection controller 70 displaces plural lenses in the projection optical system 30 based on the lens driving amount from the main controller 80. The projection controller 70 also changes a wavelength of the exposure light from the light source 12 based on a wavelength driving amount from the main controller 80.

The measurement apparatus 100 of this embodiment includes an LDI that detects the interference pattern by detecting an optical characteristic, such as a wavefront aberration, of the projection optical system 30 that serves as a target optical system. The measurement apparatus 100 includes, as shown in FIG. 1, the reticle side measuring part 100A, and the wafer side measuring side 100B.

The reticle side measuring part 100A is formed on the reticle stage 25, and includes a first mask 110. The wafer side measuring part 100B is formed on the wafer stage 45, and includes a second mask 120, an image sensor 130, and a measurement controller 140.

The first mask 110 of this embodiment is arranged on the reticle stage 25. The first mask 110 is made, for example, of a transparent substrate, such as quartz and calcium fluoride, and chrome that forms a mask pattern on the transparent substrate. The light from the illumination optical system 16 is condensed on the first mask 110 arranged on the reticle stage 25. The light condensed on the first mask 110 provides an illumination of σ=1 equal to the NAo at the object side or reticle side of the projection optical system 30.

Figure 2:
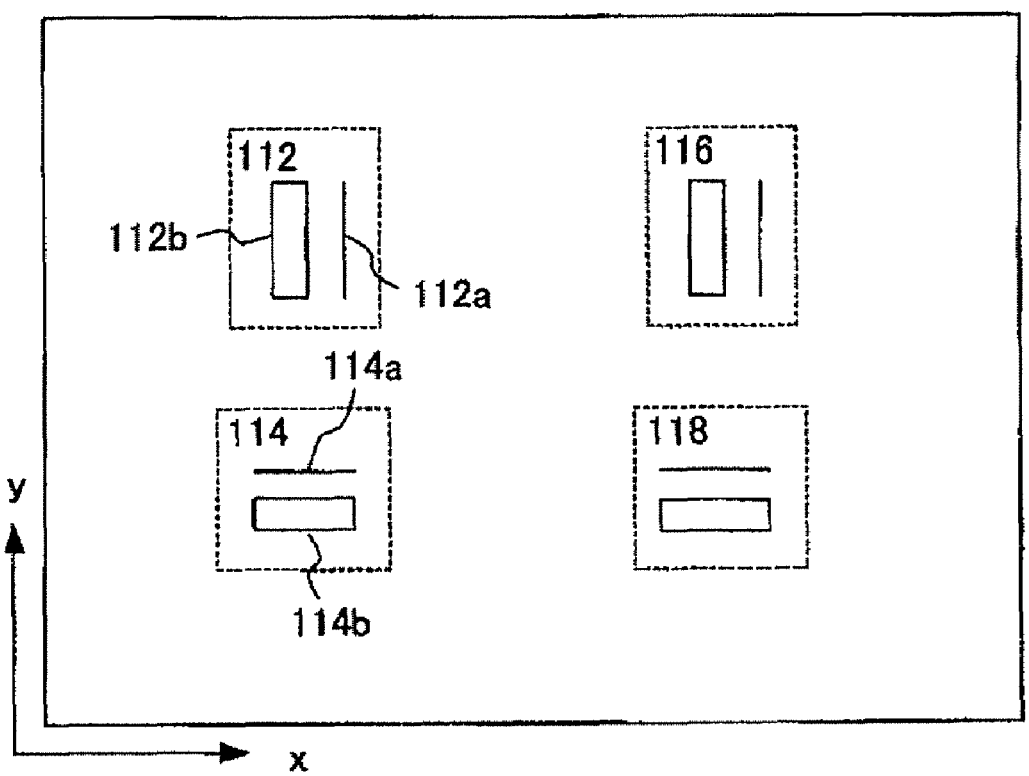
FIG. 2 is a schematic plane view showing a first mask in a measurement apparatus shown in FIG. 1.

FIG. 2 is a schematic plane view showing a structure of the first mask 110. The first mask 110 has a mark 112 that includes a slit 112a and a window 112b arranged in the 0° azimuth (Y direction), and a mark 114 that includes a slit 114a and a window 114b arranged in the 90° azimuth (X direction). The marks 112 and 114 have the same width and interval, and differ from each other in arrangement azimuth. The slit 112a and 114a have a width Δr satisfies Equation 1 below, where NAo is a numerical aperture of the projection optical system 30 at the reticle or object side, and λ is a wavelength of the light that illuminates the first mask 110:

$$\Delta r < 0.5 \times \lambda / NAo \qquad \text{Equation 1}$$

When the width of the slits 112a and 114a satisfies Equation 1, the light diffracted from the slits 112a and 114a can be regarded as an equiphase in the NAo range.

The width Δr' of the windows 112b and 114b has a size equal to or smaller than λ/NAo, but may be set equal to Equation 1. Since the light that transmits the windows 112b and 114b passes the slit of the width that satisfies Equation 1 at the wafer side as described later, the equiphase is not required at the reticle side. For the light quantity, the width Δr' of the windows 112b and 114b is preferably wide in a size range below λ/NAo.

The first mask 110 has a mark 116 having a similar shape to the mark 112, and a mark 118 having a similar shape to the mark 114. When the marks 112 and 114 deteriorate, the marks 116 and 118 may be used as substitute marks, or used to measure the wavefront aberration at different image heights without driving the reticle stage 25.

Figure 3:
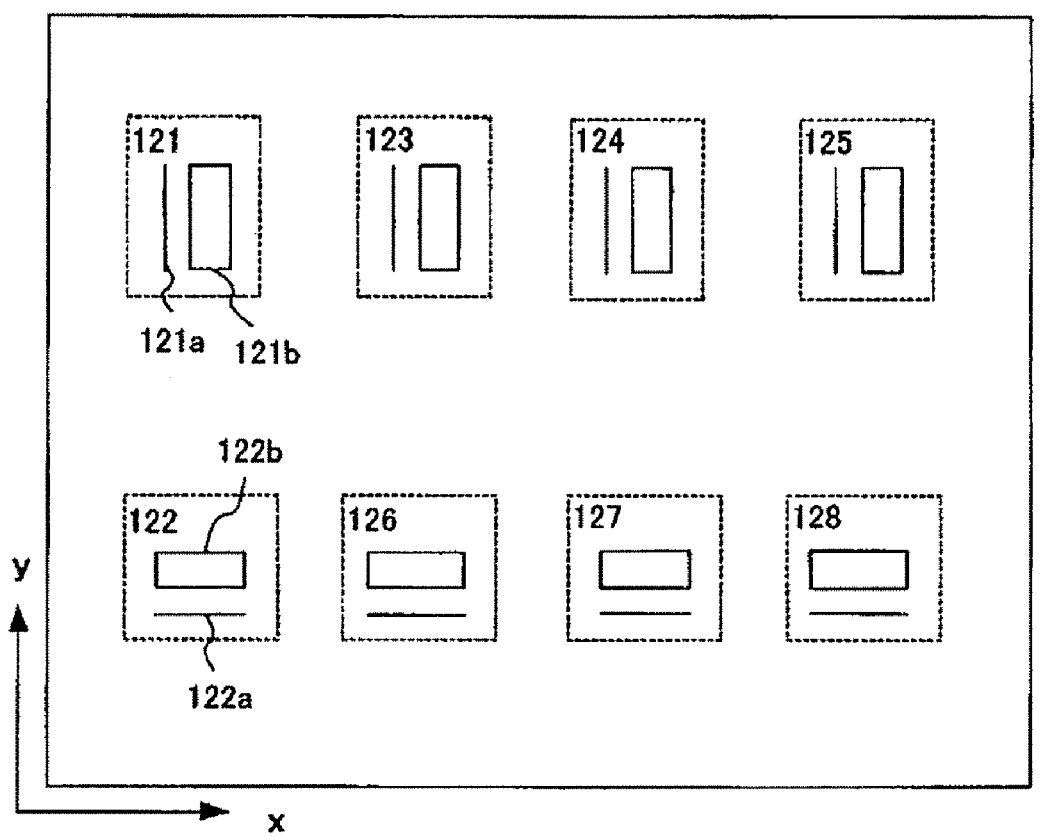
FIG. 3 is a schematic plane view showing a second mask in a measurement apparatus shown in FIG. 1.

The second mask 120 has, as shown in FIG. 3, a mark 121 that includes a slit 121a and a window 121b arranged at the 0° azimuth (Y direction), and a mark 122 that includes a slit 122a and a window 122b arranged at the 90° azimuth (X direction). FIG. 3 is a schematic plane view showing a structure of the second mask 120. The marks 121 and 122 have the same width and interval, and differ from each other in orientation azimuth. The width Δw of the slits 121a and 122a satisfies Equation 2 below, where NAi is a numerical aperture of the projection optical system 30 at the wafer or image side, and λ is a wavelength of the light that illuminates the first mask 110:

$$\Delta r < 0.5 \times \lambda / NAi \qquad \text{Equation 2}$$

When the width of the slits 121a and 122a satisfies Equation 2, the light diffracted from the slits 121a and 122a can be regarded as an equiphase in the NAi range.

The width Δw' of the windows 121b and 122b is set by a spatial frequency of the projection optical system 30 to be measured. For example, it is set wide in measuring the high frequency, and narrow in measuring the low frequency. The width Δw' of the windows 121b and 122b satisfies Equation 3, where f is a spatial frequency of the pupil in the projection optical system 30.

$$\Delta w' = 2 \times f \times \lambda / NAi \qquad \text{Equation 3}$$

For the light quantity, the Lw of the slit and the window is preferably long, but needs to be within a so-called isoplanatic region, in which the aberration of the projection optical system 30 can considered to be the same.

The second mask 120 has marks 123-125 each having a similar shape to the mark 121, and marks 126-128 having a similar shape to the mark 122. The marks 123-125 and 126-128 are preliminary marks of the marks 121 and 122, and used, for example, if the marks 121 and 122 deteriorate or are too contaminated to use. In the following description, the marks 112, 116, 121, 123-125 are referred to as an X mark, and the marks 114, 118, 122, 126-128 are referred to as a Y mark.

The image sensor 130 includes a photoelectric conversion element, such as a CCD, and is connected to the measurement controller 140 via a cable CB so that the image sensor 130 can communicate with the measurement controller 140.

The measurement controller 140 has a processor 142 and a memory 144. The processor 142 executes a process necessary to obtain aberrational information of the projection optical system 30 based on the interference pattern data input from the image sensor 130. The memory 144 stores information necessary for processes of the processor 142, such as the offset parameter, and a data group relating to a process result, such as wavefront aberration data and each Zernike coefficient.

The processor 142 uses, for example, a Fourier transformation method and an electronic moiré method in calculating phase information. The Fourier transformation method is a method that extracts a spatial frequency area containing wavefront information of a target optical system separated from one interference pattern image through a two-dimensional Fourier transformation, shifts it with respect to an origin, and takes phase information through the reverse Fourier transformation. The electronic moiré method initially uses the same carrier frequency as one interference pattern image, and produces three or more phase-shifted reference grating images. Three or more moiré patterns produced from the interference pattern image and the above reference grating image undergo the low-pass filter and a process of the phase shift method, and the phase information is extracted. The electronic moiré method can multiply and process a captured interference pattern or a reference grating image previously stored in the memory 144. The wavefront aberration information of the projection optical system 30 stored in the memory 144 in the measurement controller 140 is sent to the main controller 60.

Figure 4:
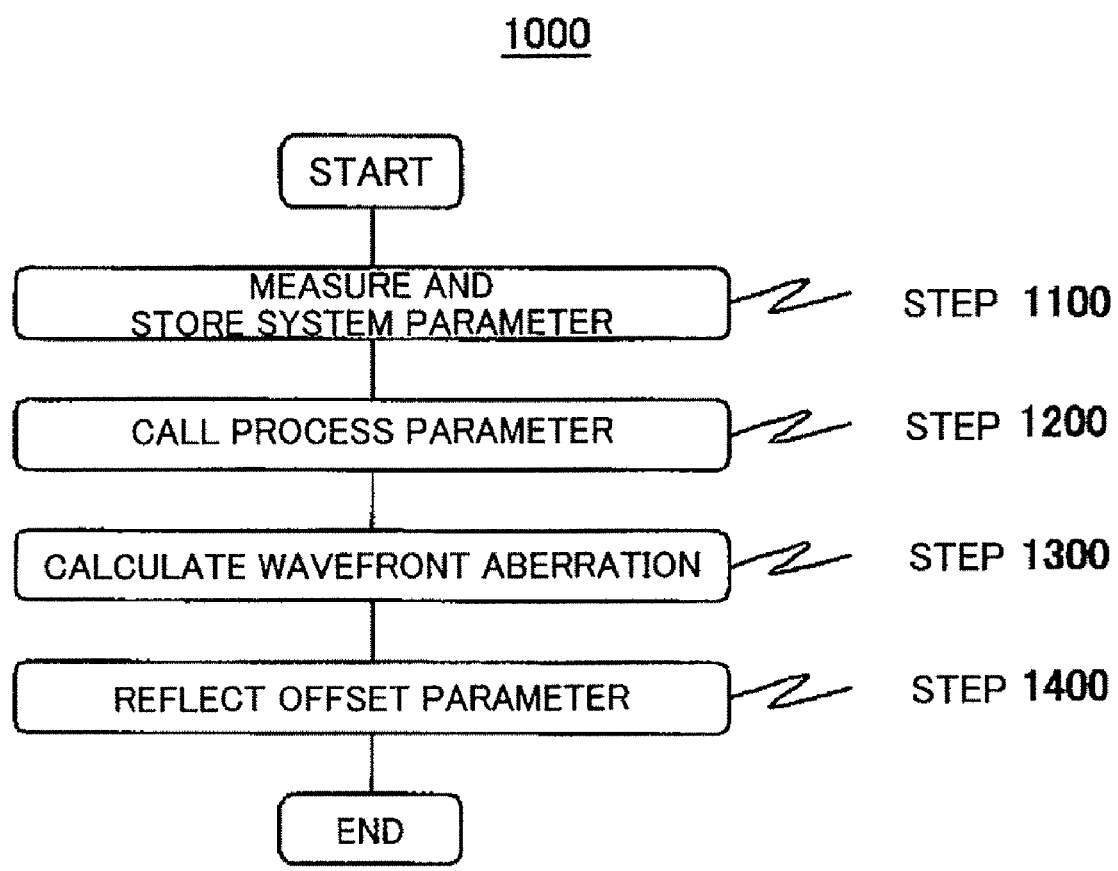
FIG. 4 is a flowchart for explaining a measurement method according to one aspect of the present invention.

Referring now to FIG. 4, a description will be given of an operation of the measurement apparatus 100 or a measurement method 1000 for measuring the wavefront aberration of the projection optical system 30. FIG. 4 is a flowchart for explaining the measurement method according to one aspect of the present invention.

The measurement method 1000 initially measures and stores a system parameter that indicates a shift from a design value of a value that defines structures of the measurement apparatus 100 and the projection optical system 30 (step 1100). The system parameter contains a process parameter input at the image processing time (used to calculate the wavefront aberration of the projection optical system 30 from the interference pattern), and an offset parameter used to correct or adjust the wavefront aberration calculated with the process parameter.

Next, among the system parameters measured and stored in the step 1100, the process parameter is called (step 1200), and the wavefront aberration of the projection optical system 30 is calculated with the called process parameter (step 1300). Lastly, an offset parameter is reflected on the wavefront of the projection optical system 30 calculated in the step 1300 (step 1400).

The system parameter is a parameter necessary in executing the image processing used to calculate the wavefront aberration of the projection optical system 30. The process parameter contains, for example, a thickness of the second mask 120 (more specifically, a thickness of a transparent substrate in the second mask 120), a distance between the second mask 120 and the image sensor 130, and a process center and radius. The process center and radius is a process region of an interference pattern formed on the image sensor 130 by the light emitted from each mark of the second mask 120.

The offset parameter is, as discussed above, a parameter used to correct the wavefront aberration calculated with the process parameter. The offset parameter is, for example, an absolute value correction amount, such as an aberrational amount of the member in the measurement apparatus 100 or the exposure apparatus 1 other than the projection optical system 30, and a linearity gain (such as an aberrational variance amount correction value of each term in the Zernike polynomial).

A description will be given of details of each step of FIG. 4.

Figure 5:
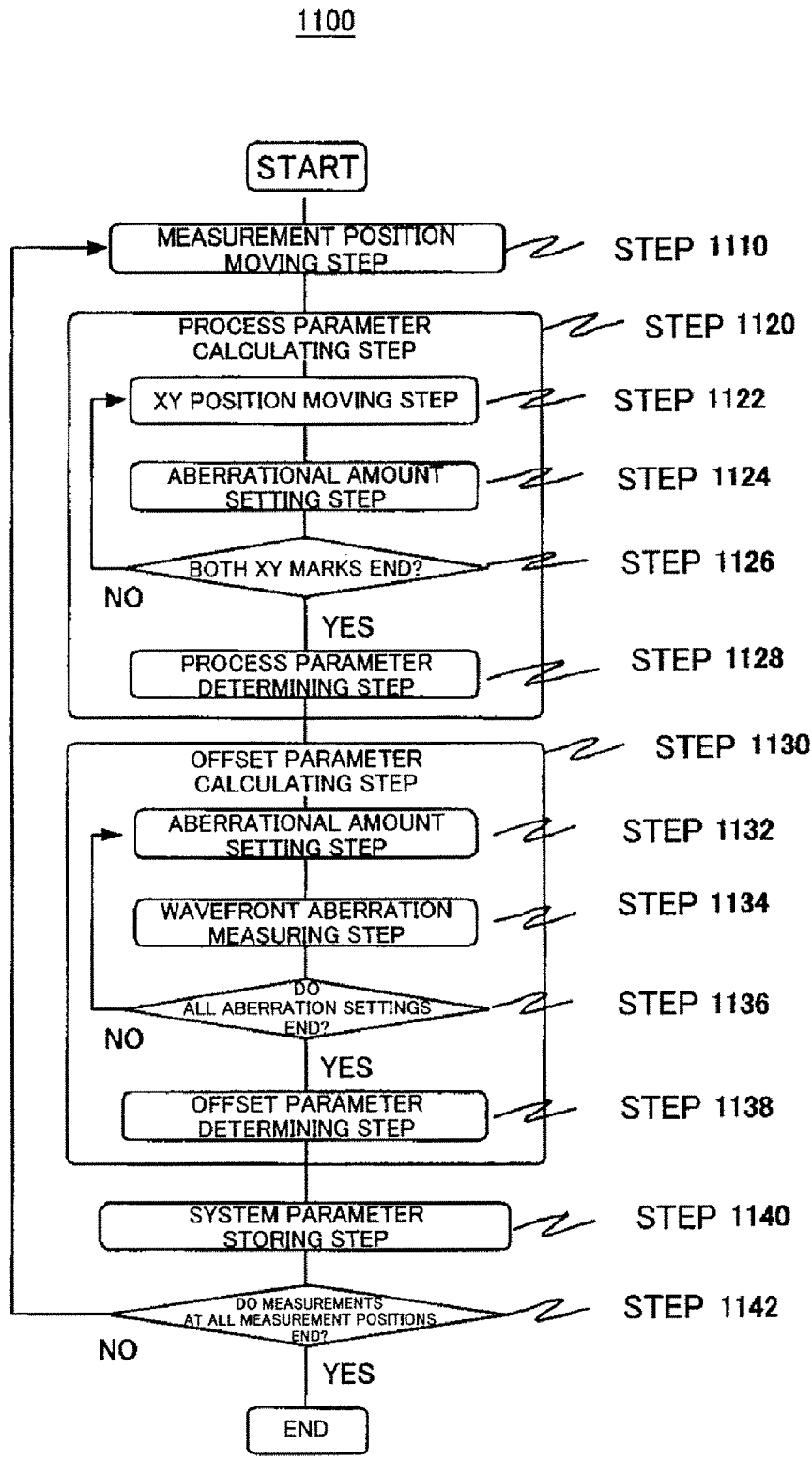
FIG. 5 is a detailed flowchart of a system parameter measurement and storage step 1100 shown in FIG. 4.

FIG. 5 is a detailed flowchart of the system parameter measurement and storage step 1100.

Initially, a measurement position moving step 1100 aligns the illumination optical system 16, the first mask 110, and the second mask 120 with each other.

The light emitted from the light source 12 is incident upon the illumination optical system 16 via the deflection optical system 14, and the o stop in the illumination optical system 16 adjusts so as to illuminate only the mark 112 in the first mask 110. Since the slit 112a has a width that satisfies Equation 1, the light emitted from the slit 112a becomes diffracted light having an equiphase wavefront in the X direction. Thereby, the light is irradiated onto the entire pupil plane in the projection optical system 30. On the other hand, the light that passes the window 112b in the first mask 110 contains the aberration of the illumination optical system 16.

The wafer stage 45 adjusts the second mask 120 so that the light emitted from the mark 112 in the first mask 110 images on the mark 121 in the second mask 120 via the projection optical system 30. Thereby, the slit 112a of the first mask 110 images on the window 121b in the second mask 120, and the window 112b in the first mask 110 images on the slit 121a in the second mask 120.

The light diffracted in the slit 121a in the mask 120 has an equiphase wavefront in the X direction. On the other hand, the light that transmits through the window 121b in the second mask 120 is shaped by the slit 112a into an equiphase wavefront in the X direction, then passes the projection optical system 30, and has wavefront aberration information of the projection optical system 30.

Figure 6:
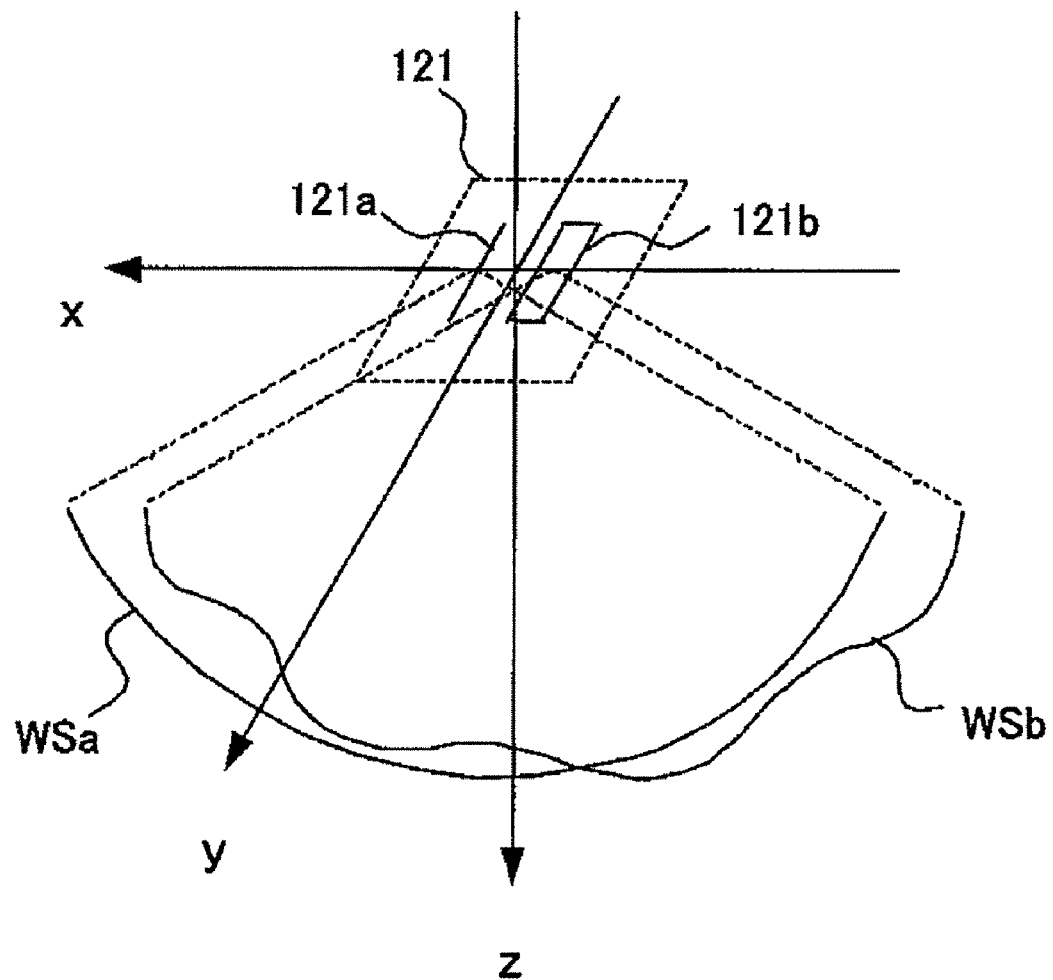
FIG. 6 is a schematic perspective view showing the light emitted from the slit and window in the second mask shown in FIG. 3.

FIG. 6 shows the light emitted from the slits 121a and 121b in the second mask 120. It understood from FIG. 6 that the light that passes the slit 121a is an ideal wavefront WSa in the X direction, and the light that passes the window 121b is a target wavefront WSb.

Figure 7:
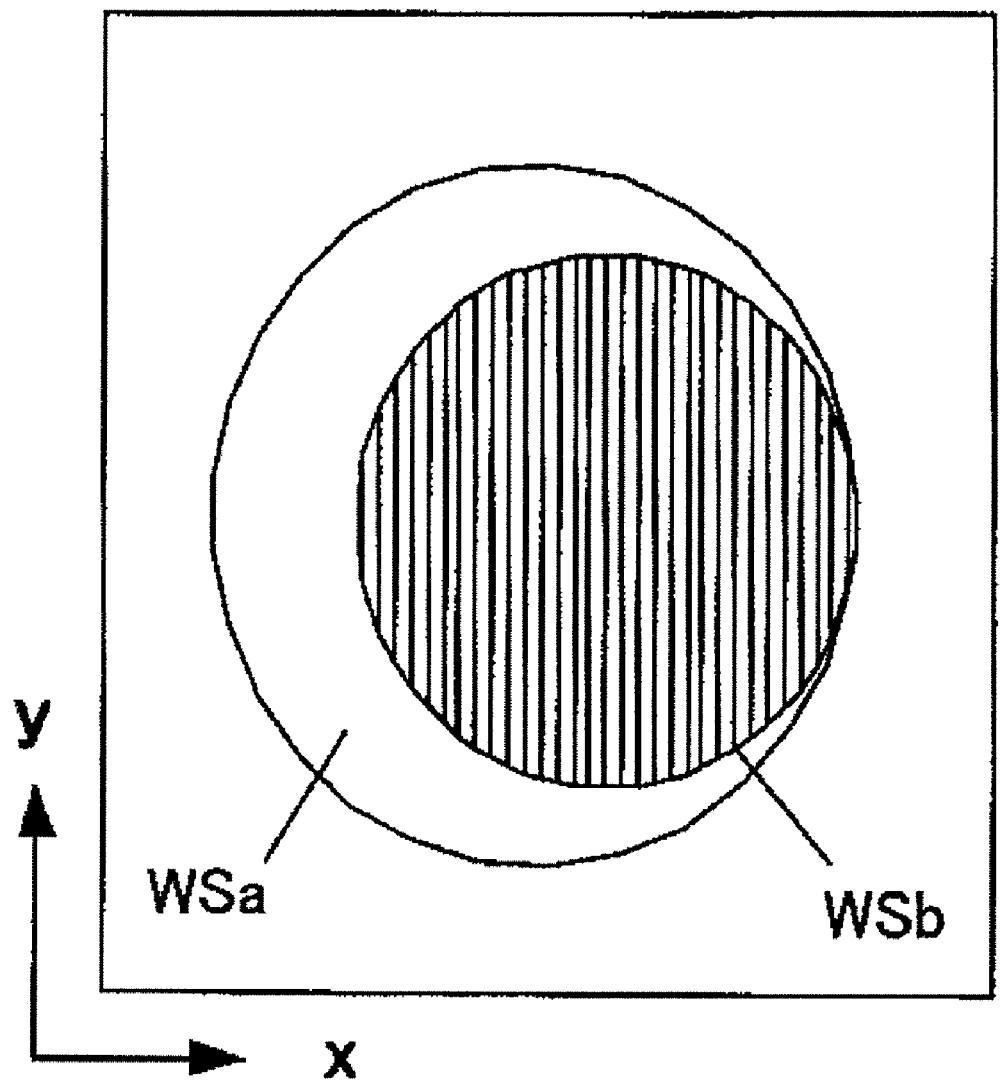
FIG. 7 is a schematic plane view showing one illustrative interference pattern between the light emitted from the slit and the light emitted from the window in the second mask detected by an image sensor of the measurement apparatus shown in FIG. 1.

FIG. 7 shows one illustrative interference pattern between the light emitted from the slit 121a and the light emitted from the window 121b, which is detected by the image sensor 130. Referring to FIG. 7, two images of the pupil of the projection optical system 30 are taken which decenter by an interval between the slit 121a and the window 121b, and an interference pattern occurs in the overlapping area.

Turning back to FIG. 5, a process parameter calculating step 1120 calculates a central coordinate and radius of the interference region detected by the image sensor 130. More specifically, the central coordinate and radius of the interference pattern are calculated by obtaining the center and radius position used to correctly measure a known aberrational amount of the spherical component generated by the projection controller 70. Among the process parameters, in this embodiment, a known measurement apparatus other than the exposure apparatus 1 previously measures a thickness of the second mask 120, and a distance between the second mask 120 and the image sensor, and these values are stored in the memory 144 in the measurement controller 140.

The process parameter calculating step 1120 has an XY position moving step 1122, an aberrational amount setting step 1124, and a process parameter determining step 1128.

781 The XY position moving step 1122 moves a position from the X mark to the Y mark, but this embodiment ends a movement to the X mark position at a measurement position moving step 1110 in this embodiment. Therefore, in calculating the X mark process parameter, the procedure moves to the next step without conducting anything.

The aberrational amount setting step 1124 drives a lens group in the projection optical system 30 via the projection controller 70 in which a relationship among an aberrational amount, a lens driving amount, and a wavelength variance amount of the projection optical system 30 is adjusted. This configuration generates a spherical aberration in the projection optical system 30, and changes its aberrational amount when the image sensor 130 captures interference pattern data. The image sensor 130 captures three pieces of interference pattern data having aberrations of 100 m$\lambda$, 200 m$\lambda$, and 300 m$\lambda$ in the spherical aberration. Plural pieces of captured interference data are output to the measurement controller 140.

The step 1126 determines whether the interference pattern data of the X mark and the interference pattern data of the Y mark are output to the measurement controller 140. Since the interference pattern data of the Y mark is not output to the measurement controller 140 in this embodiment, the procedure returns to the step 1122, and a measurement moves from the X mark position to the Y mark position. More specifically, the reticle stage 25 (first mask 110) moves so that the light from the illumination optical system 16 illuminates the mark 114 in the first mask 110. Moreover, the wafer stage 45 (second mask 120) is adjusted so that the light emitted from the mark 114 images on the mark 122 in the second mask 120 via the projection optical system 30. Thereby, the slit 110a in the first mask 110 images on the window 120b in the second mask 120. The window 110b in the first mask 110 images on the slit 120a in the second mask 120. Similar to the X mark, the spherical wavefront occurs in the projection optical system 30, and the image sensor 130 captures the interference pattern data by changing an aberrational amount.

When the interference pattern data of the X mark and that of the Y mark are output to the measurement controller 140, a process parameter (central coordinate and radius of the interference pattern) is determined based on plural pieces of interference pattern data input to the measurement controller 140 in the process parameter determining step 1128.

More specifically, a central coordinate of the interference pattern is initially calculated. In the wavefront aberration obtained from the captured interference pattern data of the X mark, it is understood from the step 1124 that the spherical aberration occurs only in the X direction in the projection optical system 30. Therefore, near the center of the interference pattern, plural different interference-pattern processes are performed with different aberrational amounts by allotting the central coordinate to the XY directions. Then, the central position having the smallest aberrational variance amount of the coma in developing the wavefront aberration in the Zernike polynomial may be determined as a central coordinate of the interference pattern.

Similar to the X mark, it is understood that the spherical aberration occurs in the projection optical system 30 only in the Y direction in the wavefront aberration obtained from the interference pattern data of the Y mark. Therefore, near the center of the interference pattern, plural interference-pattern processes are performed by allotting the central coordinate to the XY directions in developing the wavefront aberration in the Zernike polynomial. A central position having the smallest aberration variance amount of the coma may be determined as a central coordinate of the interference pattern.

A determination of the central coordinate of the above interference pattern does not depend upon the size of the radius of the interference pattern, and a provisionally fixed value, such as a design value, may be used for the radius. In order to determine the central coordinate of the interference pattern, at least two pieces of aberrational amount data among plural pieces of captured interference pattern data may be used. Alternatively, three or more pieces of aberrational amount data may be used, and an average of their variance amounts may be used.

Next, a radius of the interference pattern is determined with a central coordinate of the determined interference pattern. Plural pieces of captured interference pattern data are processed with the same radius so as to calculate a spherical aberrational amount, such as the ninth aberrational amount in the Zernike polynomial. The spherical aberration amount is calculated with the wavefront aberration after the XY wavefronts are synthesized. The synthesis of the XY wavefronts will be described later. This process is repeated with a different radius, and determines as a radius of the interference pattern a radius position at which a variance amount is calculated which accords with an aberrational variance amount among the plural pieces of interference pattern data previously known by the step 1124.

The above steps determine the process parameters, such as a thickness of the second mask 120, a distance between the second mask 120 and the image sensor 130, and a central coordinate and radius of the interference pattern, at one set of the measurement positions of the X and Y marks.

The offset parameter calculating step 1130 calculates the offset parameter. A description will now be given of the offset parameter calculating step illustratively using the linearity gain, such as a correction value of an aberration variance amount of each term in the Zernike polynomial. For example, the linearity gain is determined so that the measured aberrational variance amount of the projection optical system 30 accords with a known variance amount of the spherical aberration generated by the projection controller 70.

The offset parameter calculating step 1130 has an aberrational amount setting step 1132, a wavefront aberration measuring step 1134, and an offset parameter determining step 1138.

The aberrational amount setting step 1132 drives the lens in the projection optical system through the projection controller 70, and restrains the aberrational amount of the projection optical system 30 to a desired one. For example, in order to calculate the linearity gain in the fifth term in the Zernike polynomial, 10 m$\lambda$ is generated in the fifth term in the Zernike polynomial.

Figure 8:
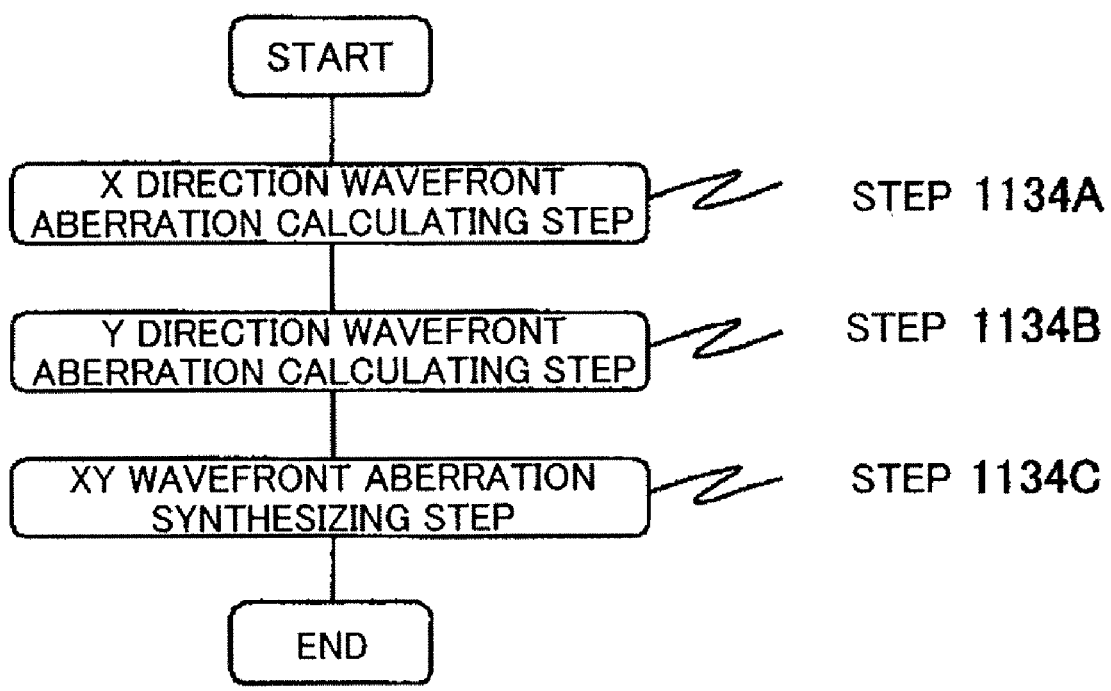
FIG. 8 is a detailed flowchart of the wavefront aberration measuring step 1134 shown in FIG. 5.

The wavefront aberration measuring step 1134 measures the wavefront aberration of the projection optical system 30 while the above aberrational amount is generated in the projection optical system 30. FIG. 8 is a detailed flowchart of the wavefront aberration measuring step 1134. The wavefront aberration measuring step 1134 includes, as shown in FIG. 8, an X direction wavefront aberration calculating step 1134A, a Y direction wavefront aberration calculating step 1134B, and an XY wavefront synthesizing step 1134C.

Similar to the XY position moving step 1122, the X direction wavefront aberration calculating step 1134A aligns the illumination optical system 16, the first mask 110 (mark 112), and the second mask 120 (mark 121). Next, the image sensor 130 captures the interference pattern data generated from the mark 121. Then, the measurement controller 140 processes the captured image pattern data so as to calculate the X direction wavefront aberration having wavefront information of the projection optical system 30 in the X direction.

The Y direction wavefront aberration calculating step 1134B aligns the illumination optical system 16, the first mask 110 (mark 114), and the second mask 120 (mark 122). Next, the image sensor 130 captures the interference pattern data generated from the mark 122. Then, the measurement controller 140 processes the captured image pattern data so as to calculate the Y direction wavefront aberration having wavefront information of the projection optical system 30 in the Y direction.

The XY wavefront synthesizing step 1134C synthesizes the X direction wavefront aberration calculated in the step 1134A with the Y direction wavefront aberration calculated in the step 1134B, calculating the wavefront aberration of the projection optical system 30 having aberrational information of the projection optical system 30 in the two-dimensional directions. Each term in the Zernike polynomial (such as the fifth to thirty-six terms in the Zernike polynomial) is calculated from this wavefront aberration, and stored in the memory 144 in the measurement controller 140. Each term in the Zernike polynomial stored in the memory 144 contains manufacturing and installation errors of the measurement apparatus 100 and exposure apparatus 1 in addition to the aberration information of the projection optical system 30.

After the wavefront aberration measuring step 1134, the step 1136 determines whether the measurement of the wavefront aberration of the projection optical system 30 ends for all the aberrational amounts. When all the wavefront aberration measurements of the projection optical system 30 do not end, the procedure returns to the step 1132 to change the aberrational amount and measure the wavefront aberration of the projection optical system 30 (step 1134).

In order to calculate the linearity gain of the fifth term in the Zernike polynomial, for example, the steps 1132 and 1134 are repeated ten times while an aberrational amount is changed every 10 mλ (10 mλ, 20 mλ, . . . ) in the fifth term in the Zernike polynomial.

The offset parameter determining step 1138 determines the offset parameter, such as a linearity gain of the fifth term in the Zernike polynomial in this embodiment. More specifically, relative variance amounts of the fifth term in the above ten Zernike polynomials differ from the aberrational change amount (every 10 mλ) in the projection optical system 30 made by the projection controller 70. Therefore, a ratio between the variance amount of the wavefront aberration measured in the measurement apparatus 100 and an aberrational variance amount of the projection optical system 30 made by the projection controller 70 is determined as a correction value of the variance amount (linearity gain).

The linearity gain of the fifth term in the Zernike polynomial is thus determined. In determining the linearity gain of each term equal to or greater than the sixth term in the Zernike polynomial, the step 1132 repeats the same operation as that used to determine the linearity gain of the fifth term by changing the number of terms for generating the aberration.

The system parameter storing step 1140 stores the system parameters, such as a process parameter and an offset parameter, calculated by the steps 1120 and 1130, in the memory 144 of the measurement controller 140. More specifically, when the marks 112 and 114 in the first mask 110 and the marks 121 and 122 in the second mask 120 are used to measure the wavefront aberration of the projection optical system 30, the process parameter and the offset parameter are stored in the memory 144 in the measurement controller 140. Here, the process parameter is, for example, a thickness of the second mask 120, a distance between the second mask 120 and the image sensor 130, and a central coordinate and radius of the interference pattern. The offset parameter is, for example, the linearity gains of the fifth to thirty-sixth terms in the Zernike polynomial.

When the absolute value is contained in the system parameter, a dedicated measurement apparatus may previously measure a wavefront state of the projection optical system 30 which provides the best exposure result, and store it in the memory 144 in the measurement controller 140.

The step 1142 determines whether the storage of the system parameter ends at all the measurement positions. The measurement position indicates, for example, a measurement position used for the preliminary mark, and a measurement position used to measure different image heights. If the storage of the system parameter has not yet ended at all the measurement positions, the procedure returns to the step 1110 to move the measurement position (for example, the marks 116 and 118 in the first mask 110 and the marks 121 and 122 in the second mask 120), similarly followed by the step 1120 to the step 1140. If the storage of the system parameter has ended at all the measurement positions, the system parameter measurement and storage step 1100 shown in FIG. 4 ends.

The step 1100 may be executed only once after the measurement apparatus 100 is manufactured. In measuring the wavefront aberration of the projection optical system 30, the system parameter stored in the step 1100 is used to execute the operation from the step 1200 to the step 1400, as described later.

The process parameter calling step 1200 calls, from the memory 144 in the measurement controller 140, the process parameter corresponding to the marks of the first mask 110 and the second mask 120 used to measure the wavefront aberration of the projection optical system 30.

The calculating step 1300 of the wavefront aberration of the projection optical system 30 uses the parameter called in the step 1200 to calculate each term in the Zernike polynomial of the wavefront aberration in the projection optical system 30 similar to the above wavefront aberration measuring step 1134. Here, each term in the Zernike polynomial contains, for example, the fifth to thirty-six terms in the Zernike polynomial.

The offset parameter reflecting step 1400 calls the offset parameter from the memory 144 in the measurement controller 140. The offset parameter corresponds to the marks in the first mask 110 and the marks in the second mask 120 used to measure the wavefront aberration of the projection optical system 30. The called offset parameter is reflected on the wavefront aberration of the projection optical system 30 calculated in the step 1300. For example, the linearity gain of each of the fifth to thirty-sixth terms in the Zernike polynomial is multiplied to the wavefront aberration of the projection optical system calculated by the step 1300 so as to correct the aberrational variance amount of each of the fifth to thirty-sixth terms calculated in the step 1300. Moreover, an absolute value of the wavefront aberration of the projection optical system 30 calculated in the step 1300 is corrected with an absolute value correction amount stored in the memory 144 in the measurement controller 140.

Thus, according to the measurement apparatus 1 and the measurement method 1000 (steps 1100 to 1400), the aberrational component resulting from the manufacturing and installation errors of the measurement apparatus 100 and the exposure apparatus 1 are removed at the measurement position (other mark positions and image height position). Therefore, the measurement apparatus 1 and the measurement method 1000 can precisely and promptly measure only the wavefront aberration of the projection optical system 30.

The measurement apparatus 1 may utilize the PDI in addition to the LDI. The measurement apparatus of the PDI utilizes a similar procedure to that for the above LDI, although the structures of the masks 110 and 120 differ. Here, FIG. 9 is a schematic plane view showing a structure of the first mask 110' and FIG. 10 is a schematic plane view showing a structure of the second mask 120'.

Figure 9:
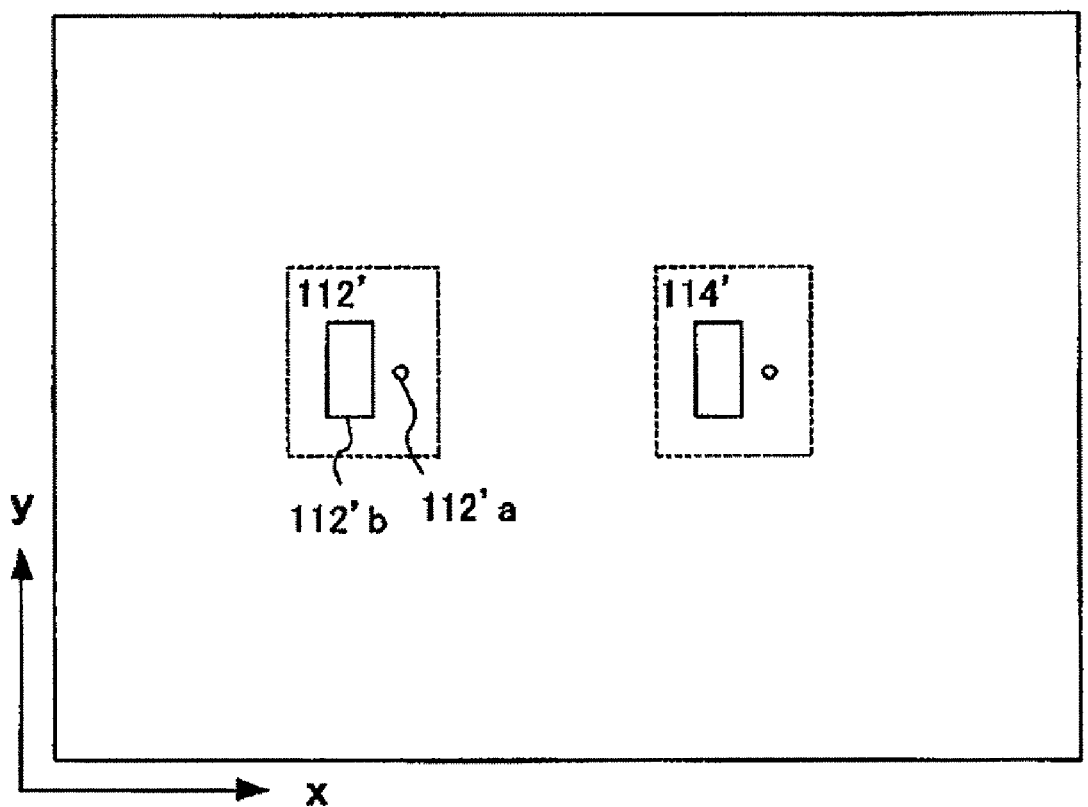
FIG. 9 is a schematic plane view showing another structure of a first mask shown in FIG. 2.
Figure 10:
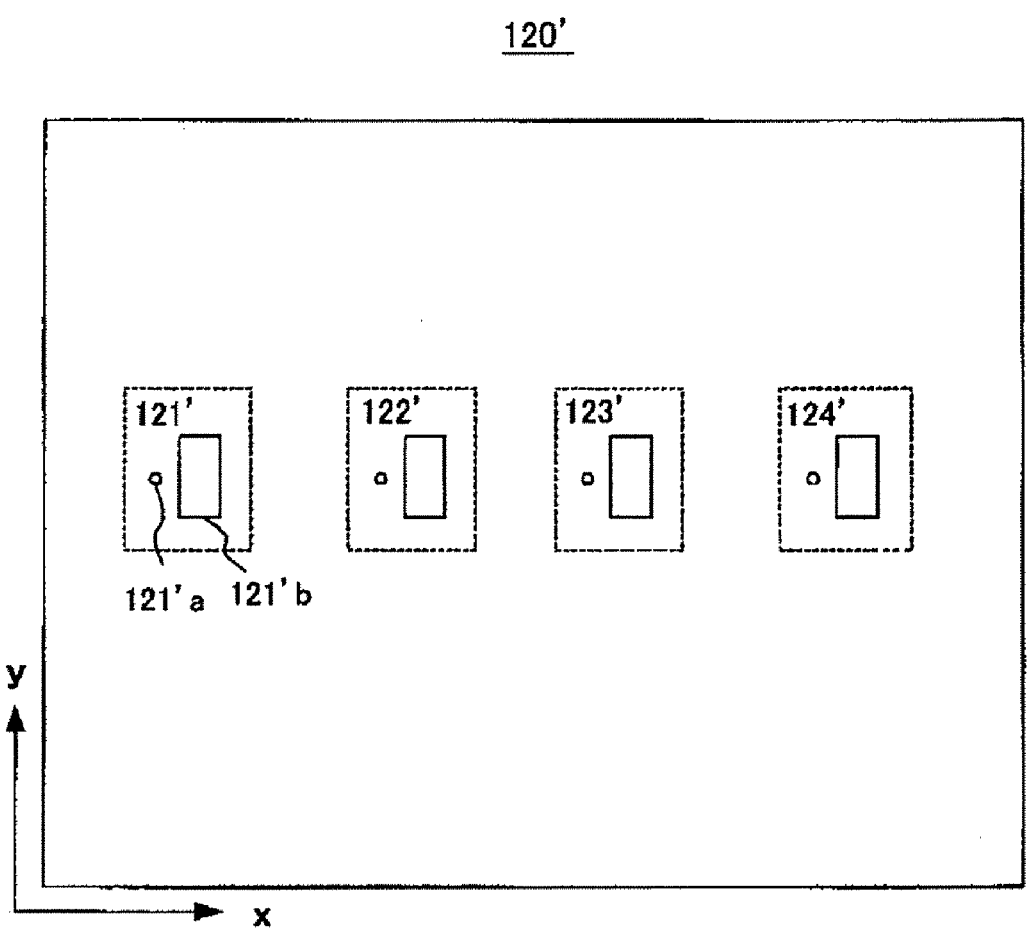
FIG. 10 is a schematic plane view showing another structure of a second mask shown in FIG. 3.

The first mask 110' has, as shown in FIG. 9, a mark 112' that includes a pinhole 112'$a$ and a window 112'$b$. The first mask 110' has a mark 114' having a similar shape as that of the mark 112'. The diameter Δr of the pinhole 112'$a$ satisfies the above Equation 1, where NAo is a reticle or object side of the projection optical system 30.

When the diameter of the pinhole 112'$a$ satisfies Equation 1, the light diffracted from the pinhole 112'$a$ can be regarded as an equiphase in the NAo range.

On the other hand, the width Δr' of the window 112'$b$ has a size equal to or smaller than λ/NAo, but may be set equal to Equation 1. However, since the light that transmits the window 112'$b$ passes the pinhole having the width that satisfies Equation 1 at the wafer side as described later, the equiphase is not required at the reticle side. Therefore, from the viewpoint of the light quantity, the width Δr' of the window 112'$b$ is preferably maintained wide in a size range below λ/NAo.

The second mask 120' has, as shown in FIG. 10, a mark 121' that includes a pinhole 121'$a$ and a window 121'$b$, and marks 122' to 124' having a similar shape to the mark 121'. The diameter Δw of the pinhole 121'$a$ satisfies Equation 2 below, where NAi is a numerical aperture of the projection optical system 30 at the wafer or image side, and λ is a wavelength of the light that illuminates the first mask 110:

The width Δw' of the window 121'$b$ is set by a spatial frequency of the projection optical system 30 to be measured. For example, it is set wide in measuring the high frequency, and narrow in measuring the low frequency. The width Δw' of the window 121'*b* satisfies the above Equation 3, where f is a spatial frequency of the pupil in the projection optical system 30. Here, the frequency f of the one-period wavefront aberration is set to 1 in the pupil radius.

A description will now be given of an operation of the measurement apparatus 100 that uses the PDI or a measurement method for measuring the wavefront aberration of the projection optical system 30. This measurement method is similar to the flowchart shown in FIG. 4. However, the flow of the measurement and storage of the system parameter shown in FIG. 5 (step 1100) is replaced with the flow of the measurement and storage of the system parameter shown in FIG. 11 (step 1100'). Here, FIG. 11 is a detailed flowchart of the measurement and storage of the system parameter of the step 1100'.

Figure 11:
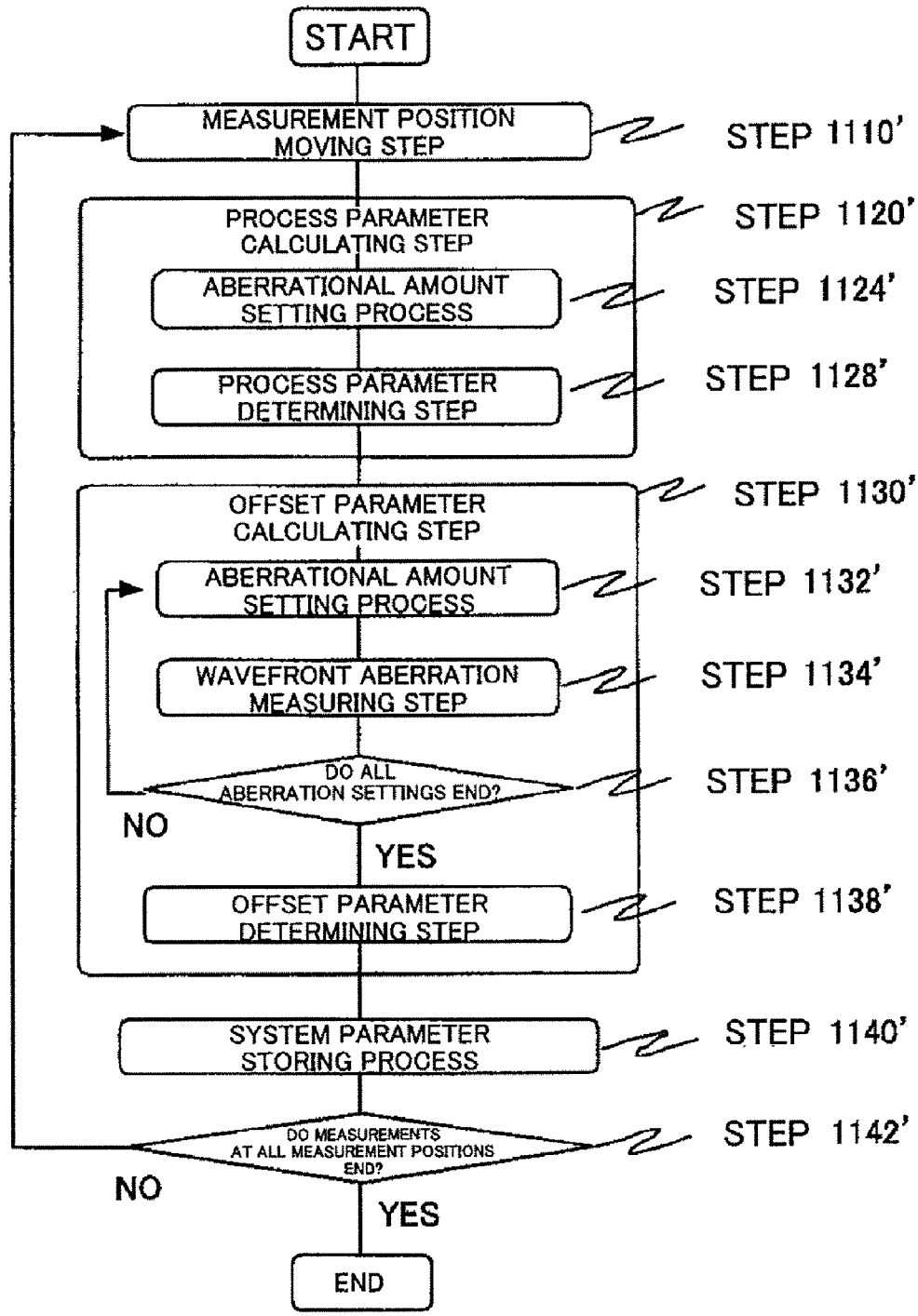
FIG. 11 is a detailed flowchart of the system parameter measurement and storage in the step 1100' as a modification of the step 1100 shown in FIG. 5.

Referring to FIG. 11, initially, the measurement position moving step 1110' aligns the illumination optical system 16, the first mask 110', and the second mask 120' with each other, as discussed later.

The light emitted from the light source 12 is incident upon the illumination optical system 16 via the deflection optical system 14, and the σ stop in the illumination optical system 16 adjusts so as to illuminate only the mark 112' in the first mask 110'. Since the pinhole 112'*a* has a width that satisfies Equation 1, the light emitted from the pinhole 112'*a* becomes diffracted light having a spherically equiphase wavefront. Thereby, the light is irradiated onto the entire pupil plane in the projection optical system 30. On the other hand, the light that passes the window 112'*b* in the first mask 110 contains the aberration of the illumination optical system 16.

The wafer stage 45 adjusts the second mask 120 so that the light emitted from the mark 112' in the first mask 110' images on the mark 121' in the second mask 120' via the projection optical system 30. Thereby, the pinhole 112'*a* of the first mask 110' images on the window 121'*b* in the second mask 120', and the window 112'*b* in the first mask 110' images on the slit 121'*a* in the second mask 120'.

The light diffracted in the pinhole 121'*a* in the mask 120' has a spherically equiphase wavefront. On the other hand, the light that transmits through the window 121'*b* in the second mask 120' is shaped by the pinhole 112'*a* into an equiphase wavefront in the X direction, then passes the projection optical system 30, and has wavefront aberration information of the projection optical system 30.

Turning back to FIG. 11, the process parameter calculating step 1120' calculates a coordinate and radius of the center of the interference region detected by the image sensor 130. The process parameter calculating step 1120' has an aberrational amount setting step 1124', and a process parameter determining step 1128'.

Similar to the step 1124, the aberrational amount setting step 1124' drives a lens group in the projection optical system 30 via the projection controller 70 in which a relationship among an aberrational amount, a lens driving amount, and a wavelength changing amount of the projection optical system 30 is adjusted. This configuration generates a spherical aberration in the projection optical system 30, and changes its aberrational amount. The image sensor 130 captures interference pattern data. Plural pieces of captured interference pattern data are output to the measurement controller 140.

The process parameter determining step 1128' determines the process parameter (a central coordinate and radius of the interference pattern) based on plural pieces of interference pattern data input to the measurement controller 140.

More specifically, the central coordinate of the interference pattern is initially calculated. It is known from the step 1124' that only the spherical aberration occurs in the wavefront aberration obtained from the captured interference pattern data. Therefore, near the center of the interference pattern, plural different interference-pattern processes are performed by corresponding to the central coordinate to the XY directions. Then, the central position having the smallest aberrational variance amount of the coma in developing the wavefront aberration in the Zernike polynomial may be determined as a central coordinate of the interference pattern.

Similar to the step 1128, in determining the central coordinate of the interference pattern, a provisionally fixed value, such as a design value, is used for the radius of the interference pattern.

A radius of the interference pattern is determined with a central coordinate of the determined interference pattern. The spherical aberration amount is calculated by processing plural pieces of captured interference pattern data using the same radius. While the step 1128 uses the wavefront aberration after the XY wavefront synthesis, the measurement apparatus 1 in the step 1128' utilizes the PDI and does not have to perform the wavefront synthesis. This process is performed by changing a radius, and the radius position from which a variance amount corresponding to the aberrational variance amount among plural pieces of interference pattern data that is previously determined from the step 1124' is determined as a radius of the interference pattern.

The offset parameter calculating step 1130' calculates the offset parameter. The offset parameter, as used herein, is a linearity gain, such as an aberrational variance amount correcting value of each term in the Zernike polynomial. The offset parameter calculating step 1130' has an aberrational amount setting step 1132', a wavefront aberration measuring step 1134', and an offset parameter determining step 1138'.

The operations of the steps 1132', 1136' and 1138' are similar to those of the steps 1132, 1136 and 1138. Therefore, only a difference between the steps 1134 and 1134' will be described.

The wavefront aberration measuring step 1134' does not need to execute three steps executed in the step 1134. The wavefront obtained from the interference pattern data generated by the marks 112 to 118 in the first mask 110 and the marks 121 to 128 in the second mask 120 used for the step 1134 have aberrational information only in a single direction of the projection optical system 30. Therefore, the wavefront aberrations in two different directions are synthesized and the two-dimensional wavefront aberration needs to be calculated.

On the other hand, the wavefront obtained from the interference pattern data generated by the marks 112' to 114' in the first mask 110' and the marks 121' to 124' in the second mask 120' used for the step 1134' have two-dimensional aberrational information of the projection optical system 30. Therefore, only the X direction wavefront aberration calculating step 1134A may be performed in the step 1134.

The system parameter storing step 1140' stores the system parameter stores the system parameters, such as a process parameter and an offset parameter, calculated by the steps 1120' and 1130' in the memory 144 of the measurement controller 140.

The step 1142' determines whether the storage of the system parameter ends at all the measurement positions. If the storage of the system parameter has not yet ended at all the measurement positions, the procedure returns to the step 1110' to move the measurement position, similarly followed by the step 1120' to the step 1140'. If the storage of the system parameter has ended at all the measurement positions, the measurement and storage of the system parameter (step 1100') end. Similar to the step 1100, the step 1100' may be performed only once after the measurement apparatus 100 is manufactured.

Similar to the step 1200, the process parameter calling step 1200' calls, from the memory 144, the process parameter corresponding to the marks of the first mask 110' and the second mask 120' used to measure the wavefront aberration of the projection optical system 30.

The calculating step 1300' of the wavefront aberration of the projection optical system 30 uses the parameter called in the step 1200' to calculate each term in the Zernike polynomial of the wavefront aberration in the projection optical system 30 similar to the above wavefront aberration measuring step 1134'. Here, each term in the Zernike polynomial is, for example, the fifth to thirty-six terms in the Zernike polynomial.

Similar to the step 1400, the offset parameter reflecting step 1400' calls the offset parameter corresponding to the marks in the first mask 110' and the marks in the second mask 120' used to measure the wavefront aberration of the projection optical system 30. The called offset parameter is reflected on the wavefront aberration of the projection optical system 30 calculated in the step 1300'.

Thus, according to the measurement apparatus 1 and the measurement method 1000 (steps 1100' to 1400'), the aberrational component resulting from the manufacture and installation errors of the measurement apparatus 100 and the exposure apparatus 1 are removed at the measurement position (other mark positions and image height position). Therefore, the measurement apparatus 1 and the measurement method 1000 can precisely and promptly measure only the wavefront aberration of the projection optical system 30.

While the exposure apparatus 1 mounted with the measurement apparatus 100 executes the measurement and storage of the system parameter shown in FIG. 4 (step 1100 or 1100'), that step does not have to necessarily be executed while the measurement apparatus 100 is mounted on the exposure apparatus 1. For example, the dedicated measurement apparatus that has similarly serves to provide driving control over the first mask 110 or 110' and the second mask 120 or 120' and serves as the projection controller 70 may measure the wavefront aberration.

Each step in the flowchart shown in FIG. 5 does not have to be conducted in its order. For example, in the above description, the steps 1132 and 1134 are repeated to measure plural aberration amounts. Nevertheless, the interference pattern data is previously obtained in the plural aberrational amounts, and the interference pattern data may be processed simultaneously.

While the measurement apparatus 1 utilizes the LDI or PDI, another interferometer, such as the LSI, which can measure as two-dimensional information an optical characteristic of a target optical system.

In exposure, the light is emitted from the light source 12 illuminates the reticle 20 via the illumination optical system 16. The light that has passed the reticle 20, and reflects the reticle pattern is imaged on the substrate 40 via the projection optical system 30. The wavefront aberration of the projection optical system 30 used for the exposure apparatus 1 is precisely measured and precisely corrected based on the measurement result. Thereby, the exposure apparatus 1 can achieve a superior exposure characteristic (high resolution), and provide a higher quality device, such as a semiconductor device and a liquid crystal display device, than ever.

Figure 12:
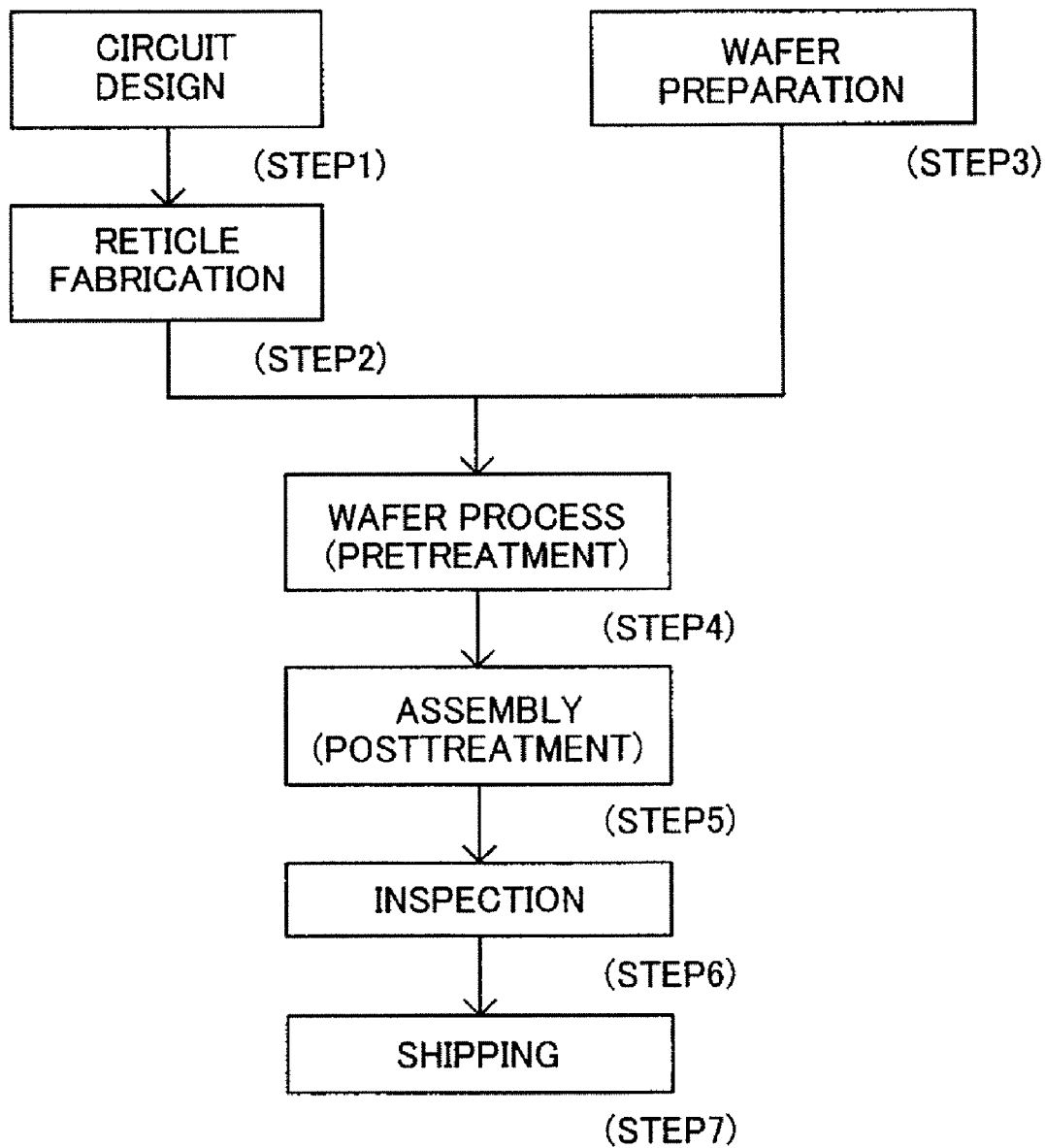
FIG. 12 is a flowchart for explaining a fabrication of a device.
Figure 13:
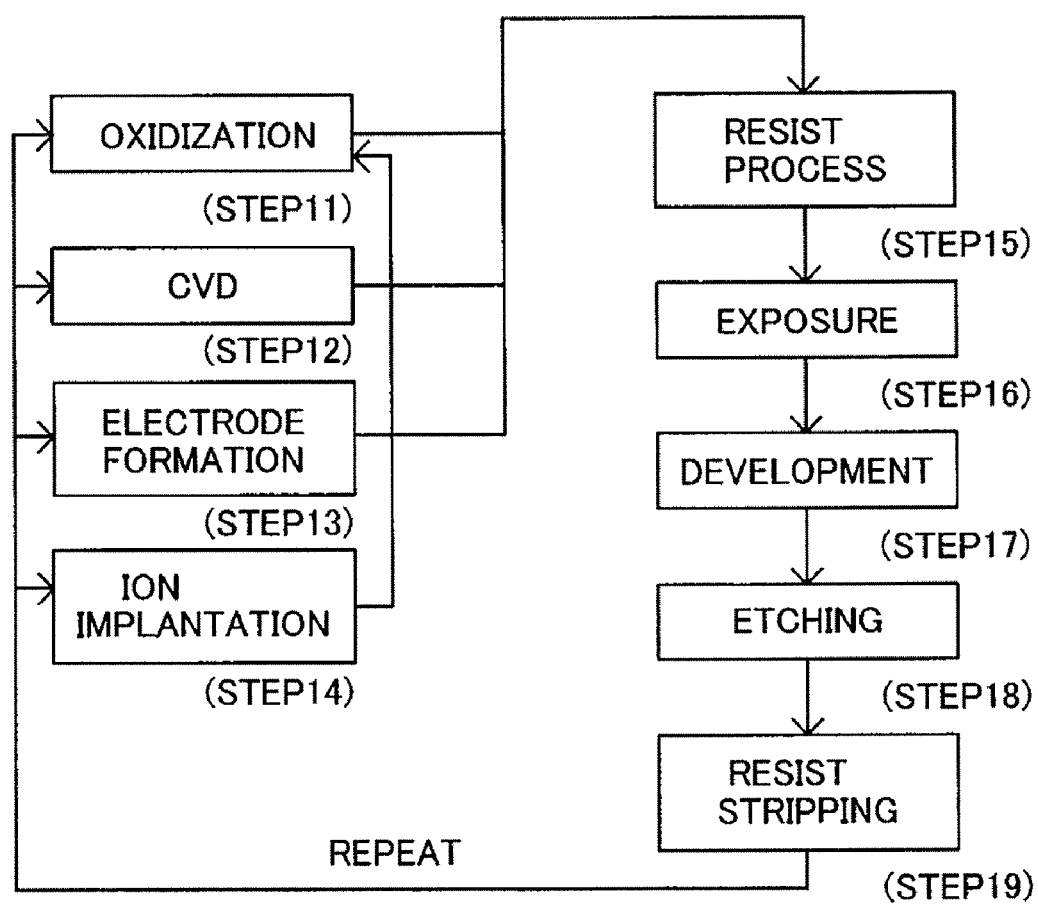
FIG. 13 is a flowchart for a wafer process of step 4 shown in FIG. 12.

Referring now to FIGS. 12 and 13, a description will be given of an embodiment of a device manufacturing method using the exposure apparatus 1. FIG. 12 is a flowchart for explaining manufacture of devices, such as a semiconductor device and a liquid crystal display device. Here, a description will be given of the fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device manufacturing method of this embodiment may manufacture higher quality devices than ever. Thus, the device manufacturing method using the exposure apparatus 1, and a resultant device also constitute one aspect of the present invention.

Further, the present invention is not limited to these preferred embodiments and various variations and modifications may be made without departing from the scope of the present invention.

This application claims a foreign priority benefit based on Japanese Patent Application No. 2006-101874, filed on Apr. 3, 2006, which is hereby incorporated by reference herein in its entirety as if fully set forth herein.

What is claimed is:

1. A measurement method for measuring a wavefront aberration of a target optical system using a measurement apparatus that measures the wavefront aberration of the target optical system by detecting an interference pattern, said measurement method comprising the steps of:

measuring as a system parameter a shift from a design value of a value that defines a structure of the measurement apparatus and the target optical system; and measuring the wavefront aberration of the target optical system using the system parameter;

wherein the system parameter measuring step includes the steps of:

obtaining at least one of a thickness of a member that generates the interference pattern, a distance between the member and an image sensor that takes an image of the interference pattern, a central coordinate of the interference pattern on the image sensor, a radius of the interference pattern on the image sensor, a linearity gain used to adjust a variance amount of the wavefront aberration of the target optical system, and an absolute value used to adjust an absolute amount of the wavefront aberration of the target optical system; and storing as the system parameter the at least one of the thickness of the member that generates the interference pattern, the distance between the member and the image sensor that takes the image of the interference pattern, the central coordinate of the interference pattern on the image sensor, the radius of the interference pattern on the image sensor, the linearity gain used to adjust the variance amount of the wavefront aberration of the target optical system, and the absolute value used to adjust the absolute amount of the wavefront aberration of the target optical system, wherein the step of obtaining a central coordinate of the interference on the image sensor includes the steps of:

generating an aberration of a spherical component of the target optical system;

obtaining plural pieces of interference pattern data by changing an amount of an aberration generated by the generating step; and determining as the central coordinate a central position having the smallest variation amount of the aberration other than the spherical component among the plural pieces of interference pattern data obtained by the obtaining step.

2. A measurement method for measuring a wavefront aberration of a target optical system using a measurement apparatus that measures the wavefront aberration of the target optical system by detecting an interference pattern, said measurement method comprising the steps of:

measuring as a system parameter a shift from a design value of a value that defines a structure of the measurement apparatus and the target optical system; and measuring the wavefront aberration of the target optical system using the system parameter;

wherein the system parameter measuring step includes the steps of:

obtaining at least one of a thickness of a member that generates the interference pattern, a distance between the member and an image sensor that takes an image of the interference pattern, a central coordinate of the interference pattern on the image sensor, a radius of the interference pattern on the image sensor, a linearity gain used to adjust a variance amount of the wavefront aberration of the target optical system, and an absolute value used to adjust an absolute amount of the wavefront aberration of the target optical system: and storing as the system parameter the at least one of the thickness of the member that generates the interference pattern, the distance between the member and the image sensor that takes the image of the interference pattern, the central coordinate of the interference pattern on the image sensor, the radius of the interference pattern on the image sensor, the linearity gain used to adjust the variance amount of the wavefront aberration of the target optical system, and the absolute value used to adjust the absolute amount of the wavefront aberration of the target optical system, wherein the step of obtaining the radius of the interference pattern on the image sensor includes the steps of:

generating a known amount of an aberration of the spherical component in the target optical system;

obtaining plural pieces of interference pattern data by changing an amount of the aberration generated by the generating step; and determining as the radius a value at which a variance amount of the aberration of the spherical component of the plural pieces of interference pattern data obtained by the obtaining step accords with a known variance amount of the aberration of the spherical component.

3. A measurement method for measuring a wavefront aberration of a target optical system using a measurement apparatus that measures the wavefront aberration of the target optical system by detecting an interference pattern, said measurement method comprising the steps of:

measuring as a system parameter a shift from a design value of a value that defines a structure of the measurement apparatus and the target optical system; and measuring the wavefront aberration of the target optical system using the system parameter;

wherein the system parameter measuring step includes the steps of:

obtaining at least one of a thickness of a member that generates the interference pattern, a distance between the member and an image sensor that takes an image of the interference pattern, a central coordinate of the interference pattern on the image sensor, a radius of the interference pattern on the image sensor, a linearity gain used to adjust a variance amount of the wavefront aberration of the target optical system, and an absolute value used to adjust an absolute amount of the wavefront aberration of the target optical system; and storing as the system parameter the at least one of the thickness of the member that generates the interference pattern, the distance between the member and the image sensor that takes the image of the interference pattern, the central coordinate of the interference pattern on the image sensor, the radius of the interference pattern on the image sensor, the linearity gain used to adjust the variance amount of the wavefront aberration of the target optical system, and the absolute value used to adjust the absolute amount of the wavefront aberration of the target optical system, wherein the step of obtaining the linearity gain includes the steps of:

generating a known amount of an aberration of a specific component in the target optical system;

obtaining plural pieces of interference data by changing an amount of the aberration generated by the generating step; and calculating a ratio between a variance amount of the aberration of the specific component of the plural pieces of interference data obtained by the obtaining step and a known variance amount of the aberration of the specific component.

* * * * *